United States Patent
Bin et al.

(10) Patent No.: US 9,455,175 B2
(45) Date of Patent: Sep. 27, 2016

(54) CONVEYING APPARATUS

(71) Applicant: DISCO CORPORATION, Tokyo (JP)

(72) Inventors: Wu Bin, Tokyo (JP); Kodai Mikami, Tokyo (JP); Shojiro Yamada, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/993,359

(22) Filed: Jan. 12, 2016

(65) Prior Publication Data

US 2016/0204018 A1 Jul. 14, 2016

(30) Foreign Application Priority Data

Jan. 13, 2015 (JP) .................................. 2015-004275

(51) Int. Cl.
| | |
|---|---|
| *B66F 19/00* | (2006.01) |
| *H01L 21/683* | (2006.01) |
| *H01L 21/677* | (2006.01) |
| *H01L 21/67* | (2006.01) |
| *B25J 15/06* | (2006.01) |
| *B25J 11/00* | (2006.01) |

(52) U.S. Cl.
CPC ........ *H01L 21/6838* (2013.01); *B25J 11/0095* (2013.01); *B25J 15/0616* (2013.01); *H01L 21/67259* (2013.01); *H01L 21/67784* (2013.01)

(58) Field of Classification Search
CPC B25J 9/1692; B25J 15/0014; B25J 15/0616; B25J 15/0085; B25J 11/0095; B25J 9/042; B25J 9/10; B25J 15/0052; B25J 13/082; B25J 5/061; B25J 11/005; H01L 21/6838; H01L 21/67742; H01L 21/67103; H01L 21/6833; H01L 21/67259; H01L 21/67784; H02N 13/00; B66C 1/02

USPC ............... 294/213, 902, 907, 185; 414/749.1
See application file for complete search history.

(56) References Cited

U.S. PATENT DOCUMENTS

| | | | | |
|---|---|---|---|---|
| 2004/0228719 A1* | 11/2004 | Woodruff | ................... | B25J 5/02 414/744.5 |
| 2005/0123383 A1* | 6/2005 | Goto | .................. | H01L 21/67259 414/416.08 |
| 2005/0287769 A1* | 12/2005 | Lee | .................... | H01L 21/67173 438/460 |
| 2007/0017560 A1* | 1/2007 | Kiyota | .............. | H01L 21/67742 134/137 |
| 2007/0199860 A1* | 8/2007 | Asari | ........................ | F27B 5/04 206/710 |

FOREIGN PATENT DOCUMENTS

| | | |
|---|---|---|
| JP | 07-211766 | 8/1995 |
| JP | 2005-011917 | 1/2005 |

* cited by examiner

*Primary Examiner* — Stephen Vu
(74) *Attorney, Agent, or Firm* — Greer Burns & Crain Ltd.

(57) ABSTRACT

A conveying apparatus includes a holding plate having a holding surface destined to face a surface of a wafer to be held; a restriction member on one end side of the holding surface adapted to contact the periphery of the wafer so as to restrict movement of the wafer; and a moving unit adapted to move the holding plate. At the holding surface, a non-contact type suction holding part is adapted to jet a fluid obliquely to the surface of the wafer to be held so as to move the wafer toward the restriction member and generate a negative pressure between the holding surface and the surface to be held, thereby holding the wafer by suction. The fluid is jetted from the suction holding part so as to abut the wafer against the restriction member, thereby positioning the wafer at a predetermined position on the holding plate.

1 Claim, 6 Drawing Sheets

CONVEYING APPARATUS

BACKGROUND OF THE INVENTION

1. Field of the Invention

The present invention relates to a conveying apparatus for conveying a wafer in the inside of a processing apparatus or the like.

2. Description of the Related Art

In a manufacturing process of a semiconductor device or the like, normally, wafers are accommodated in a cassette and conveyed in this state into a variety of processing apparatuses. Each of the wafers conveyed into the processing apparatus is taken out of the cassette by a conveying mechanism, and is placed, for example, on a chuck table adapted to hold the wafer by suction. The wafer placed on the chuck table is processed by a processing unit, and is thereafter accommodated again in the cassette. In each of these processing apparatuses, it is important to adjust the position, orientation and the like of each wafer relative to the chuck table, for the purpose of maintaining the quality of the wafers processed. In view of this, a processing apparatus having a positioning mechanism by which the position, orientation and the like of a wafer relative to a chuck table can be adjusted has been put to practical use (refer to, for example, Japanese Patent Laid-Open No. Hei 7-211766 and Japanese Patent Laid-Open No. 2005-11917).

SUMMARY OF THE INVENTION

In the aforementioned processing apparatus, the position, orientation and the like of a wafer are adjusted by the positioning mechanism before placing the wafer onto the chuck table by a conveying mechanism. If such a positioning mechanism is provided, however, the processing apparatus would be increased in size and cost, and a long time would be required for positioning the wafer.

It is therefore an object of the present invention to provide a conveying apparatus by which positioning of a wafer can be performed at the time of conveying the wafer.

In accordance with an aspect of the present invention, there is provided a conveying apparatus including: a holding plate having a holding surface destined to face a surface to be held of a wafer; a restriction member provided on one end side of the holding surface, the restriction member adapted to contact a peripheral surface of the wafer so as to restrict movement of the wafer toward the one end side; and moving means for moving the holding plate. A non-contact type suction holding part is formed at the holding surface, the suction holding part adapted to jet a fluid obliquely to the surface to be held of the wafer so as to move the wafer in a direction toward the restriction member and to generate a negative pressure between the holding surface and the surface to be held, thereby holding the wafer by suction, and the fluid is jetted from the suction holding part so as to abut the wafer against the restriction member, thereby positioning the wafer at a predetermined position on the holding plate.

In accordance with an aspect of the present invention, the conveying apparatus as above preferably has a configuration wherein a sensor for detecting a notch indicative of crystal orientation of the wafer is disposed at a position corresponding to the peripheral surface of the wafer. The suction holding part includes: a first suction holding part connected to a fluid supply source through a first suction path provided with a first opening control valve for controlling flow rate, the first suction holding part adapted to jet the fluid in a direction for rotating the wafer in a first rotating direction; and a second suction holding part connected to the fluid supply source through a second suction path provided with a second opening control valve for controlling flow rate, the second suction holding part adapted to jet the fluid in a direction for rotating the wafer in a second rotating direction opposite to the first rotating direction. An opening of one of the first opening control valve and the second opening control valve is set to be greater than an opening of an other of the first opening control valve and the second opening control valve so as to rotate the wafer in the first rotating direction or the second rotating direction, and, after detection of the notch by the sensor, the opening of the first opening control valve or the second opening control valve is controlled so as to stop rotation of the wafer, thereby positioning the notch in a predetermined orientation relative to the holding plate.

The conveying apparatus according to the present invention includes the holding plate having the holding surface destined to face the surface to be held of the wafer, and the restriction member adapted to contact the peripheral surface of the wafer so as to restrict movement of the wafer, wherein the suction holding part is formed at the holding surface, the suction holding part adapted to jet a fluid obliquely to the surface to be held of the wafer so as to move the wafer in a direction toward the restriction member and to generate a negative pressure between the holding surface and the surface to be held, thereby holding the wafer by suction. Therefore, by jetting the fluid from the suction holding part so as to abut the wafer against the restriction member, it is possible to position the wafer at a predetermined position on the holding plate. In other words, in accordance with the conveying apparatus of the present invention, positioning of a wafer can be carried out at the time of conveying the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
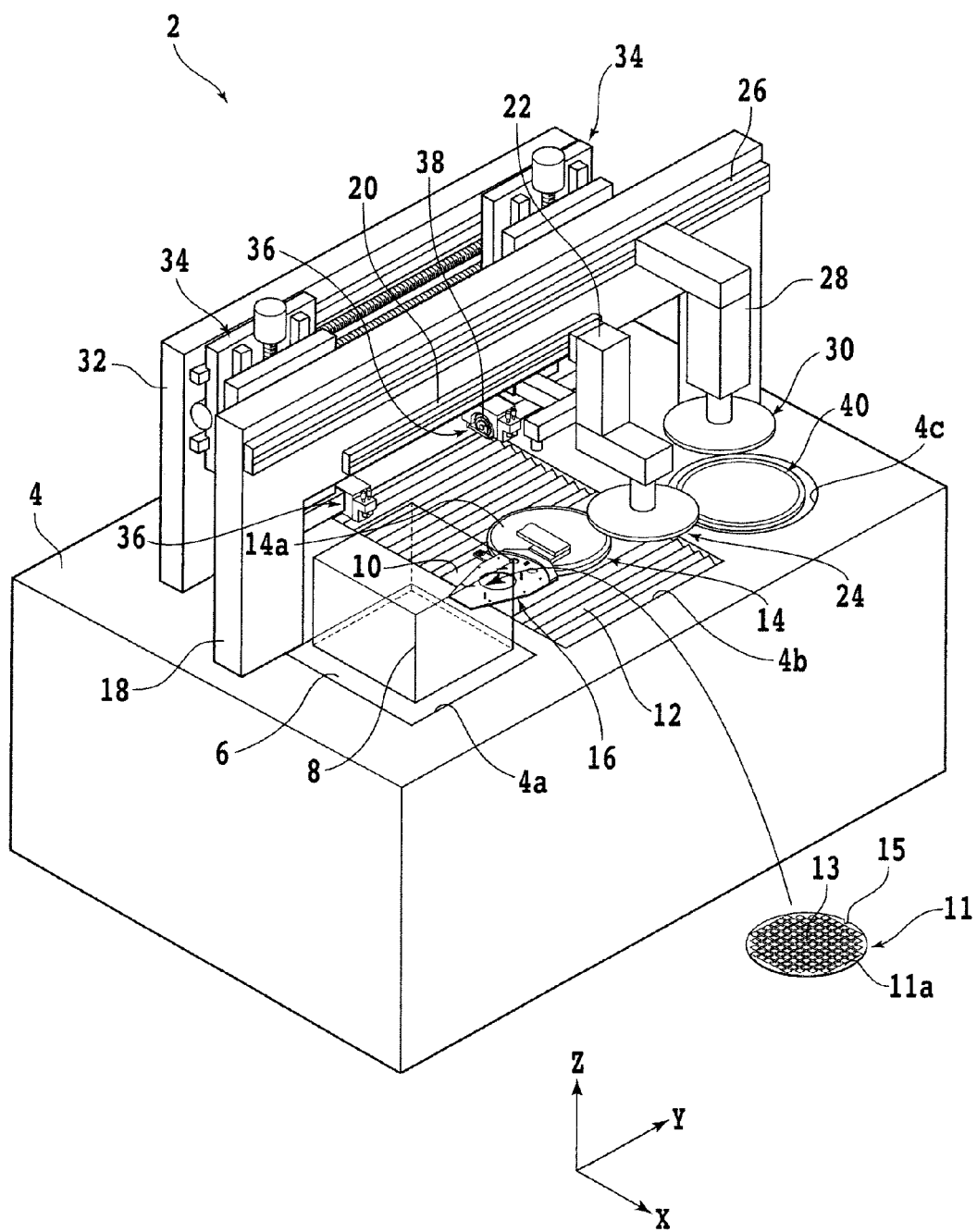
FIG. 1 is a perspective view showing schematically a configuration example of a processing apparatus including a conveying apparatus.

An embodiment of the present invention will now be described referring to the attached drawings. FIG. 1 is a perspective view showing schematically a configuration example of a processing apparatus including a conveying apparatus according to the present embodiment. Note that while a processing apparatus (cutting apparatus) for cutting a wafer is exemplified in the present embodiment, the conveying apparatus of the present invention can be provided in other processing apparatuses. Naturally, the conveying apparatus of the present invention may be used alone.

As illustrated in FIG. 1, a processing apparatus 2 has a base 4 which supports each of structures. The base 4 is formed, at a corner portion on a forward side, with an opening 4a which is rectangle-shaped in plan view, and a cassette mount 6 is disposed in the opening 4a in a liftable manner. On a top surface of the cassette mount 6 is disposed a rectangular parallelepiped-shaped cassette 8 for accommodating a plurality of wafers 11. Note that only the profile of the cassette 8 is depicted in FIG. 1, for convenience of explanation.

The wafer 11 is, for example, a substantially circular plate-shaped substrate formed of silicone or the like. A front surface 11a (an upper surface in FIG. 1) of the wafer 11 is divided into a central device region and a peripheral marginal region surrounding the device region. The device region is further partitioned into a plurality of regions by crossing streets (division lines), with a device 13 such as an IC being formed in each of the regions. In addition, the wafer 11 is formed at a peripheral edge with a notch 15 which indicates crystal orientation. Note that the wafer 11 is not restricted to the one depicted in the drawing, but may be other plate-shaped substrate such as a semiconductor substrate, a resin substrate, a ceramic substrate, etc.

At a lateral side of the cassette mount 6, there is formed an opening 4b which is elongate in an X-axis direction (front-rear direction, or processing feeding direction). In the opening 4b, there are provided an X-axis moving table 10, an X-axis moving mechanism (processing feeding means) (not shown) for moving the X-axis moving table 10 in the X-axis direction, and a dust-proof and droplet-proof cover 12 which covers the X-axis moving mechanism. The X-axis moving mechanism includes a pair of X-axis guide rails (not shown) parallel to the X-axis direction, and the X-axis moving table 10 is slidably disposed on the X-axis guide rails. A nut portion (not shown) is provided on the lower surface side of the X-axis moving table 10, and the nut portion is in screw engagement with an X-axis ball screw (not shown) parallel to the X-axis guide rails. An X-axis pulse motor (not shown) is connected to one end portion of the X-axis ball screw. With the X-axis ball screw rotated by the X-axis pulse motor, the X-axis moving table 10 is moved in the X-axis direction along the X-axis guide rails.

Over the X-axis moving table 10, there is provided a chuck table 14 for holding the wafer 11 by suction. The chuck table 14 is connected with a rotational drive source (not show) such as a motor, and is rotated about a rotational axis parallel to a Z-axis direction (vertical direction). Besides, the chuck table 14 is put to processing feeding in the X-axis direction by the aforementioned X-axis moving mechanism. A front surface (top surface) of the chuck table 14 is a holding surface 14a on which to hold the wafer 11 by suction. The holding surface 14a is connected to a suction source (not shown) through a flow path (not shown) formed in the inside of the chuck table 14.

In the processing apparatus 2, a conveying apparatus 16 for taking out the aforementioned wafer 11 from the cassette 8 and conveying the wafer 11 to the chuck table 14 is provided at a position close to the opening 4b. The wafer 11 conveyed by the conveying apparatus 16 is mounted on the holding table 14 so that the front surface 11a thereof is exposed to the upper side, for example. The conveying apparatus 16 will be described in detail later.

On the top surface of the base 4, a gate-shaped first support structure 18 is disposed straddling the opening 4b. A first rail 20 parallel to a Y-axis direction (left-right direction, or indexing direction) is fixed onto a front surface of the first support structure 18, and a first holding unit 24 is connected to the first rail 20 through a first lift unit 22. The first holding unit 24 is moved in the Z-axis direction by the first lift unit 22, and is moved in the Y-axis direction along the first rail 20. For instance, a wafer 11 conveyed from the cassette 8 by the conveying apparatus 16 is transferred to the first holding unit 24, and is placed on the chuck table 14.

On a front surface of the first support structure 18, a second rail 26 parallel to the Y-axis direction is fixed over the first rail 20, and a second holding unit 30 is connected to the second rail 26 through a second lift unit 28. The second holding unit 30 is moved in the Z-axis direction by the second lift unit 28, and is moved in the Y-axis direction along the second rail 26.

On the rear side of the first support structure 18, a gate-shaped second support structure 32 is disposed. On a front surface of the second support structure 32, two blade units 36 are provided through each of moving units 34. The blade units 36 are moved in the Y-axis direction and the Z-axis direction by the moving units 34. Each of the blade units 36 has a spindle (not shown) supported in a rotatable manner. An annular cutting blade 38 is mounted to one end of the spindle. A motor (not shown) is connected to the other end of the spindle, and the cutting blade 38 is rotated by a rotating force transmitted from the motor. With the cutting blade 38 rotated and caused to cut into the wafer 11 suction held by the chuck table 14, the wafer 11 can be processed.

At a position on the opposite side of the opening 4b from the opening 4a, there is formed a circular opening 4c. A cleaning unit 40 for cleaning the wafer 11 is disposed in the opening 4c. The wafer 11 processed by the cutting blade 38 is conveyed to the cleaning unit 40 by the second holding unit 30. The wafer 11 cleaned by the cleaning unit 40 is transferred to the conveying apparatus 16 by the first holding unit 24, and is conveyed into the cassette 8.

Figure 2:
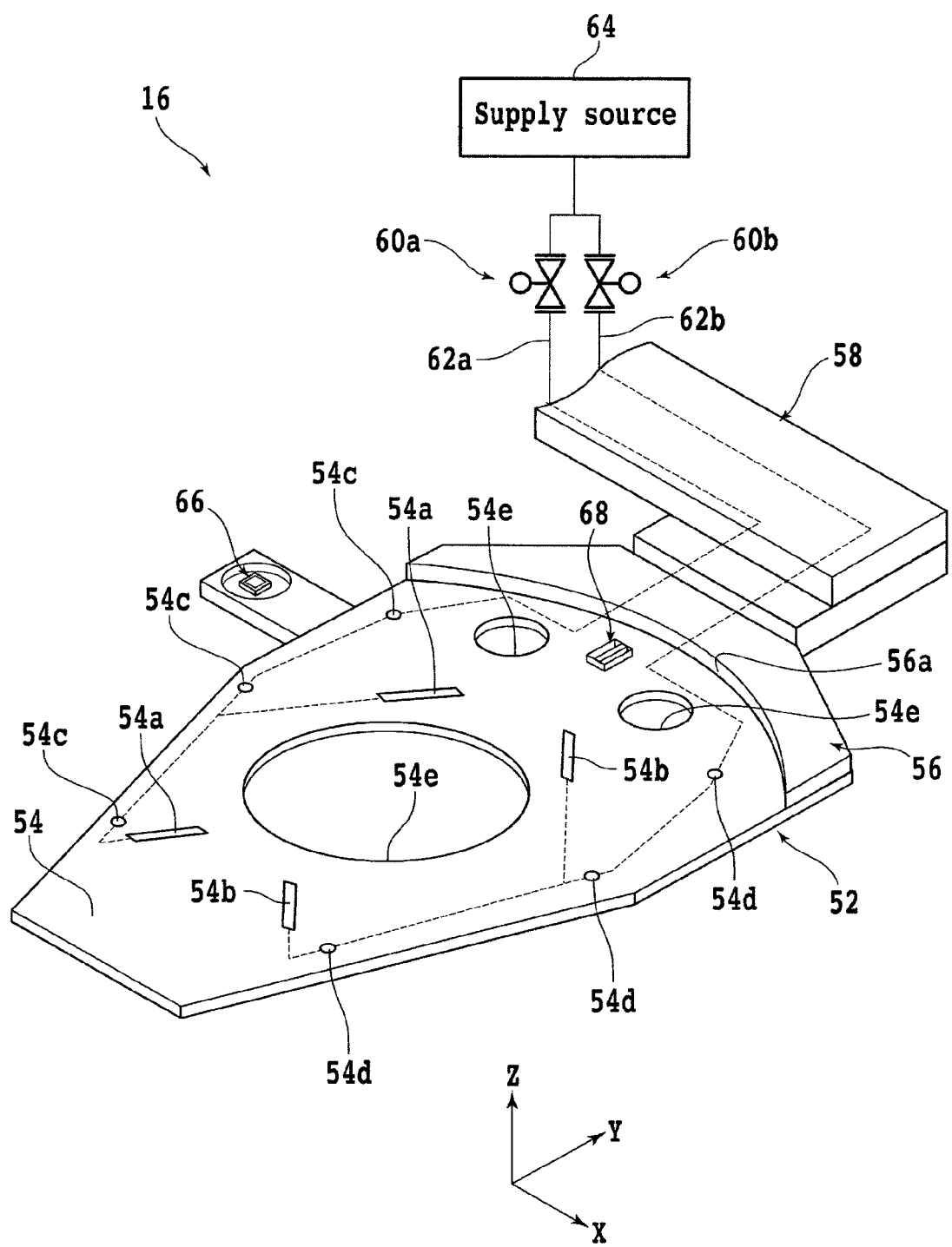
FIG. 2 is a figure showing schematically the conveying apparatus.

FIG. 2 shows the conveying apparatus 16 schematically. The conveying apparatus 16 has a holding plate 52 for holding the wafer 11. A surface on one side (a top surface in the present embodiment) of the holding plate 52 constitutes a holding surface 54 which faces a surface to be held (a lower surface in the present embodiment) of the wafer 11 and on which the wafer 11 is held by suction. On one end side of the holding surface 54, there is disposed a restriction member 56 which restricts movement of the wafer 11 in a direction parallel to the holding surface 54. The restriction member 56 has a side surface 56a so shaped as to correspond to a peripheral surface of the wafer 11. With the peripheral surface of the wafer 11 abutted against the side surface 56a, the wafer 11 is positioned at a predetermined position on the holding plate 52.

A moving arm (moving means) 58 is connected to one end side of the holding plate 52 and the restriction member 56. The holding plate 52 and the restriction member 56 are moved in each direction by the moving arm 58. In the holding surface 54, there are formed first jet ports (first suction holding parts) 54a and second jet ports (second suction holding parts) 54b for jetting air (fluid) obliquely to a surface to be held of the wafer 11. In addition, a plurality of auxiliary jet ports 54c and 54d for jetting auxiliary air for preventing contact between the wafer 11 and the holding surface 54 are provided in the holding surface 54.

The first jet ports 54a and the auxiliary jet ports 54c are connected to an air supply source (fluid supply source) 64 through a first suction path 62a provided with a first opening control valve 60a for controlling the flow rate of air. On the other hand, the second jet ports 54b and the auxiliary jet ports 54d are connected to the air supply source 64 through a second suction path 62b provided with a second opening control valve 60b for controlling the flow rate of air. Therefore, when the surface to be held of the wafer 11 is set facing the holding surface 54 and the openings of the first opening control valve 60a and the second opening control valve 60b are controlled, air can be blown to the surface to be held of the wafer 11.

When flow velocity of air flowing through a gap between the surface to be held of the wafer 11 and the holding surface 54 is raised, the pressure inside the gap is lowered according to Bernoulli's theorem. Therefore, by controlling the openings of the first opening control valve 60a and the second opening control valve 60b to generate a predetermined negative pressure in the gap between the surface to be held of the wafer 11 and the holding surface 54, the wafer 11 can be suction held by the holding plate 52. Note that the holding plate 52 is formed with a plurality of through-holes 54e piercing through the holding plate 52 from the holding surface 54 to a surface opposite to the holding surface 54. Therefore, part of air blown to the surface to be held of the wafer 11 is released through the through-holes 54e to the side of the surface opposite to the holding surface 54.

Figure 3A:
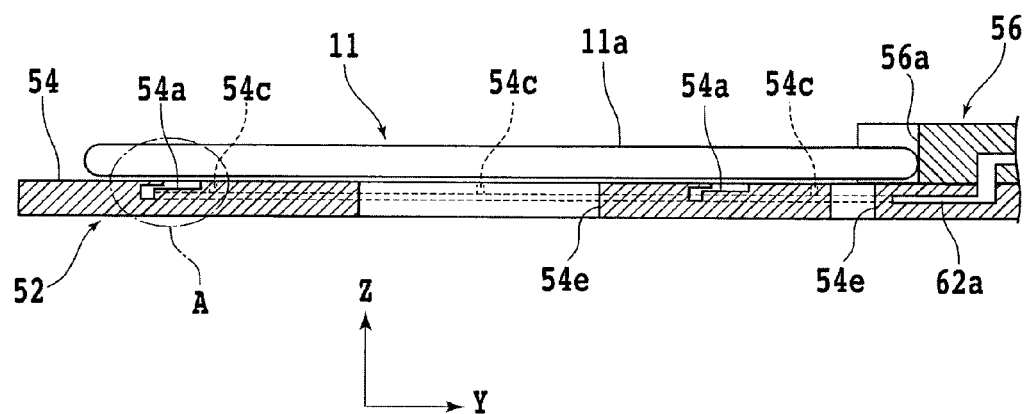
FIG. 3A is a partly sectional side view showing schematically a state in which a wafer is held by suction.
Figure 3B:
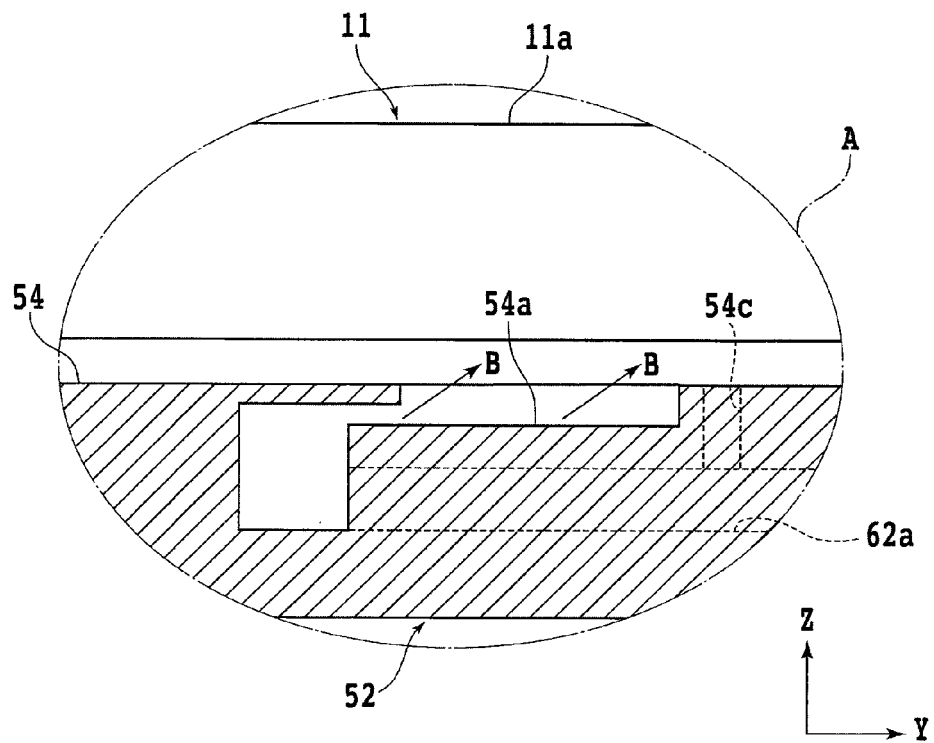
FIG. 3B is an enlarged view showing schematically an air jetting direction.

FIG. 3A is a partly sectional side view showing schematically a state in which the wafer 11 is held by suction, and FIG. 3B is an enlarged view showing schematically an air jetting direction. Note that FIG. 3B shows region A of FIG. 3A in an enlarged form. As shown in FIG. 3B, air jetting direction B in the first jet ports 54a is inclined toward one end side (the restriction member 56 side) of the holding surface 54. The air injecting direction in the second jet ports 54b is also inclined. Therefore, when air is blown from the first jet ports 54a and the second jet ports 54b onto the surface to be held of the wafer 11, the wafer 11 is moved in a direction toward the restriction member 56. As a result, a peripheral surface of the wafer 11 can be abutted against the side surface 56a of the restriction member 56, and the wafer 11 can thereby be positioned at a predetermined position on the holding plate 52.

Note that the air jetting direction B at the first jet ports 54a is inclined to a direction for rotating the wafer 11 in a first rotating direction (for example, clockwise in plan view). On the other hand, the air jetting direction at the second jet ports 54b is inclined to a direction for rotating the wafer 11 in a second rotating direction (for example, counterclockwise in plan view) opposite to the first rotating direction. Therefore, when the opening of one of the first opening control valve 60a and the second opening control valve 60b is set to be greater than the opening of the other, the wafer 11 can be rotated in the first rotating direction or the second rotating direction. As illustrated in FIG. 2, a notch detecting sensor 66 for detecting the notch 15 in the wafer 11 is disposed at a position corresponding to the peripheral surface of the wafer 11 so that the orientation of the wafer 11 can be adjusted by utilizing the aforementioned rotation. In adjusting the orientation of the wafer 11, first, the wafer 11 is rotated in the first rotating direction or the second rotating direction, and the notch 15 is detected by the notch detecting sensor 66. Thereafter, the opening of the first opening control valve 60a or the second opening control valve 60b is controlled at an arbitrary timing, and the rotation of the wafer 11 is stopped, whereby the notch 15 can be positioned in a predetermined orientation relative to the holding plate 52.

In addition, a wafer detecting sensor 68 for detecting whether the wafer 11 is present or absent is provided at the holding surface 54 of the holding plate 52. Note that the notch detecting sensor 66 may be provided with the function of the wafer detecting sensor 68. In that case, the wafer detecting sensor 68 can be omitted.

Figure 4A:
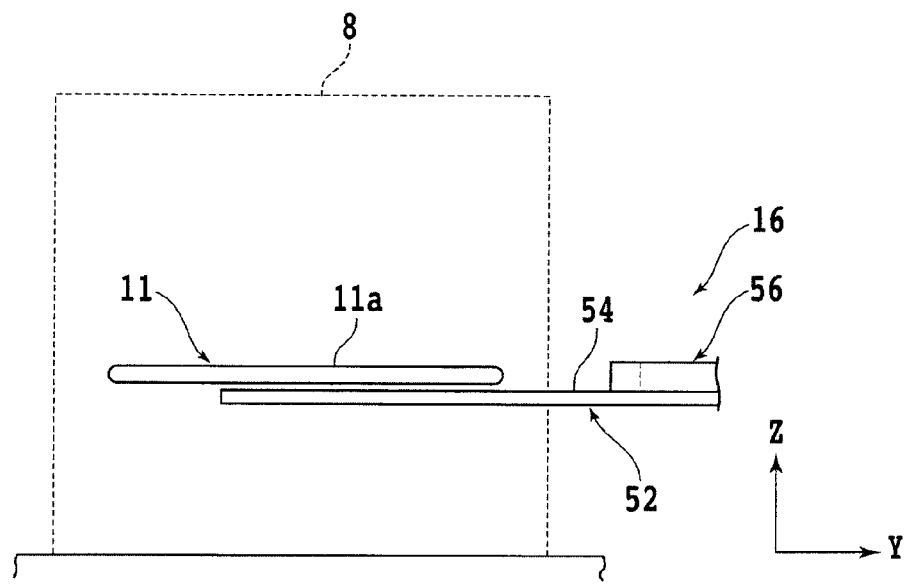
FIGS. 4A and 4B are figures showing schematically a manner in which the wafer is taken out of a cassette.
Figure 4B:
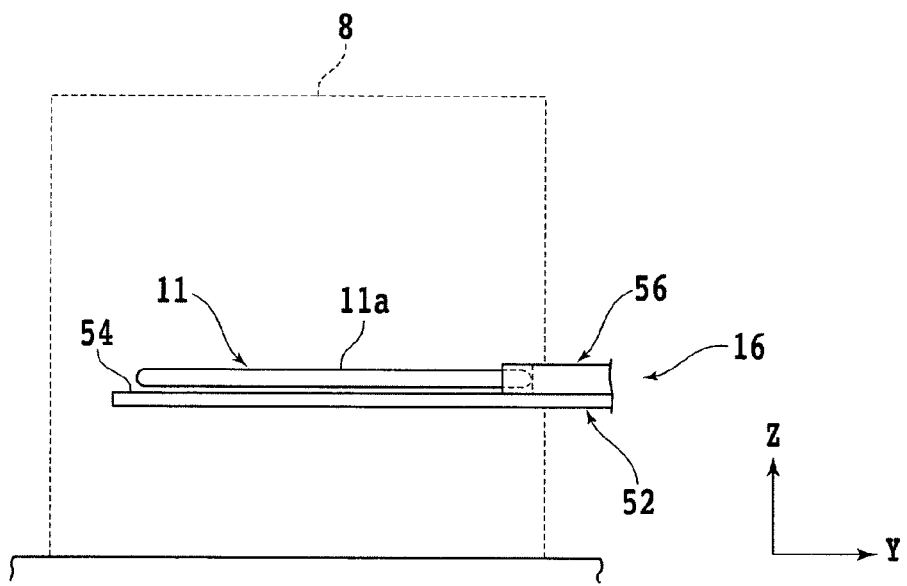

A procedure of conveying the wafer 11 by the aforementioned conveying apparatus 16 will now be described. FIGS. 4A and 4B illustrate schematically a manner in which the wafer 11 is taken out of the cassette 8. First, as shown in FIG. 4A, the holding plate 52 of the conveying apparatus 16 is inserted into the inside of the cassette 8, and the holding surface 54 is made to face the surface to be held (lower surface) of the wafer 11. Next, the holding plate 52 is brought closer to the surface to be held of the wafer 11 to such an extent as not to contact the surface to be held, and air is jetted from the first jet ports 54a and the second jet ports 54b to the surface to be held of the wafer 11. As a result, a predetermined negative pressure is generated in a gap between the surface to be held of the wafer 11 and the holding surface 54, and the wafer 11 is held onto the holding plate 52 by suction. In addition, the wafer 11 is abutted against the restriction member 56, and is thereby positioned at a predetermined position on the holding plate 52. Note that in holding the wafer 11 on the holding plate 52 by suction, a control may be performed such that air is jetted after the wafer 11 is placed on the holding plate 52 (namely, after the holding surface 54 is brought into contact with the surface to be held of the water 11).

Figure 5:
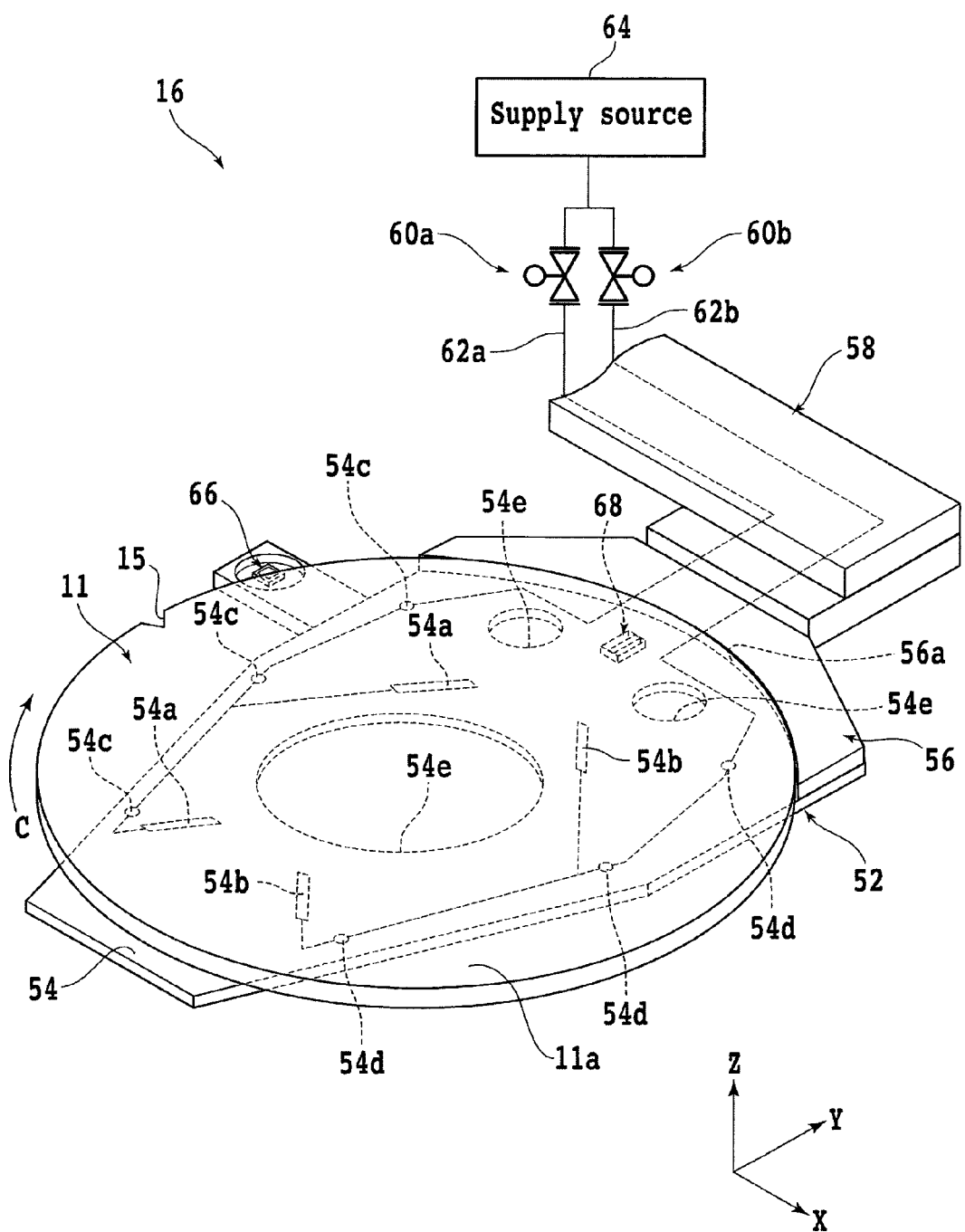
FIG. 5 is a figure showing schematically a manner in which the wafer is rotated.
Figure 6:
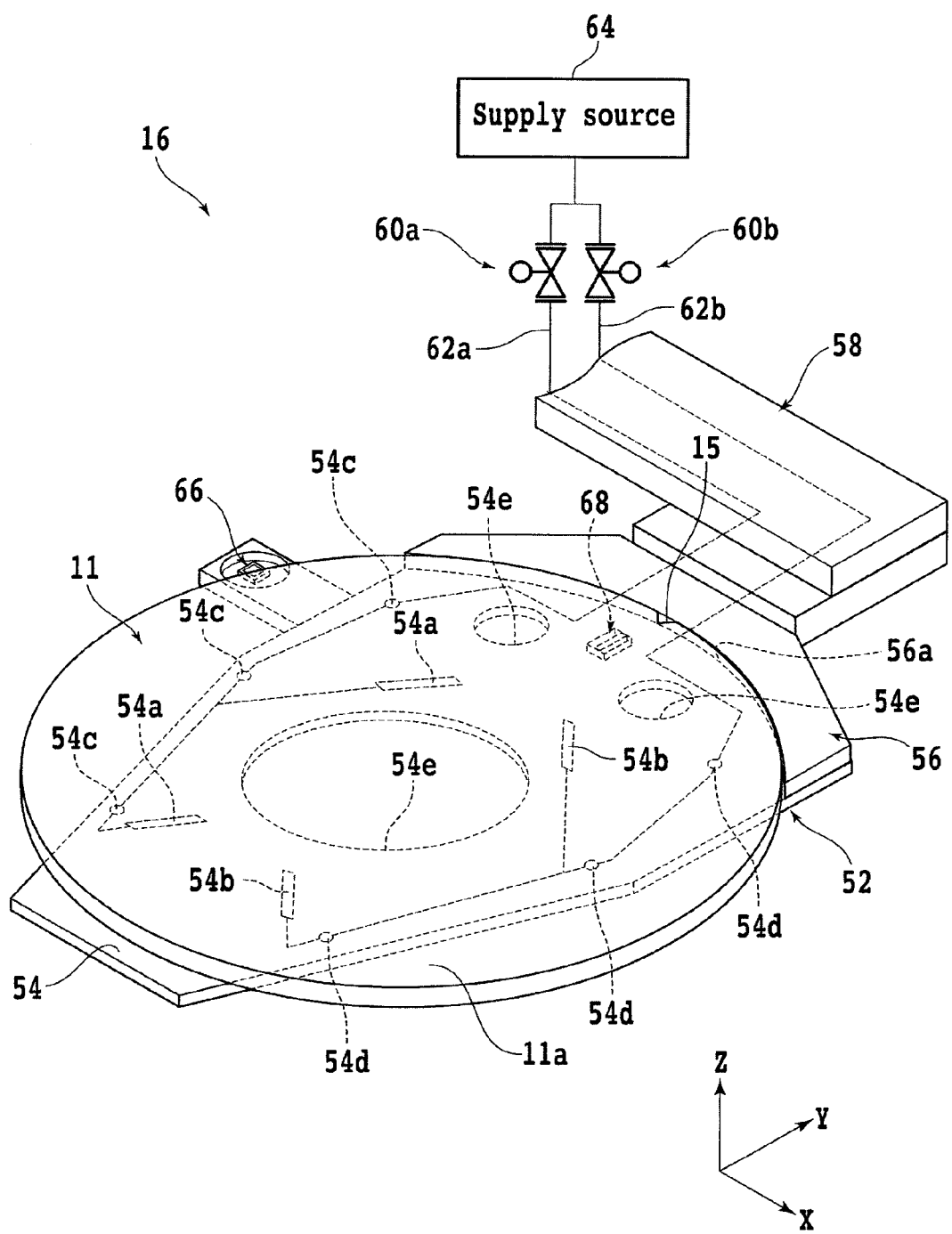
FIG. 6 is a figure showing schematically a manner in which a notch of the wafer is positioned in a predetermined orientation.

After the wafer 11 is positioned at a predetermined position on the holding plate 52, the orientation of the wafer 11 is adjusted. FIG. 5 is a figure showing schematically a manner in which the wafer 11 is rotated, and FIG. 6 is a figure showing schematically a manner in which the notch 15 of the wafer 11 is positioned in a predetermined orientation. Note that in FIGS. 5 and 6, devices 13 and the like on the wafer 11 are omitted. For instance, the opening of the first opening control valve 60a is set to be greater than the opening of the second opening control valve 60b, and the wafer 11 is rotated in a first rotating direction C, as shown in FIG. 5. Then, the notch 15 of the wafer 11 is detected by the notch detecting sensor 66. Subsequently, the opening of the first opening control valve 60a and the opening of the second opening control valve 60b are controlled to be substantially the same, so as to stop the rotation of the wafer 11 as shown in FIG. 6. Here, the control of the openings of the first opening control valve 60a and the second opening control valve 60b is carried out at such a timing that the notch 15 is positioned in a desired direction, taking into account the timing of detection of the notch 15 by the notch detecting sensor 66, the rotational speed of the wafer 11 and the like. By this operation, the notch 15 of the wafer 11 is positioned in a predetermined orientation in relation to the holding plate 52.

As has been described above, the conveying apparatus 16 according to the present embodiment includes the holding plate 52 having the holding surface 54 destined to face the surface to be held of the wafer 11, and the restriction member 56 which contacts the peripheral surface of the wafer 11 so as to restrict movement of the wafer 11. The holding surface 54 is formed therein with the first jet ports (first suction holding parts) 54a and the second jet ports (second suction holding parts) 54b which jet a fluid obliquely to the surface to be held of the wafer 11, so as to move the wafer 11 in a direction toward the restriction member 56 and to generate a negative pressure between the holding surface 54 and the surface to be held, thereby holding the wafer 11 by suction. Therefore, by jetting air (fluid) from the first jet ports 54a and the second jet ports 54b so as to abut the wafer 11 against the restriction member 56, the wafer 11 can be positioned at a predetermined position on the holding plate 52.

In addition, the conveying apparatus 16 according to the present embodiment is provided with the notch detecting sensor 66 for detecting the notch 15 indicative of the crystal orientation of the wafer 11. Therefore, by setting the opening of one of the first opening control valve 60a and the second opening control valve 60b to be greater than the opening of the other to thereby rotate the wafer 11 in the first rotating direction or the second rotating direction and by controlling the opening of the first opening control valve 60a or the second opening control valve 60b to thereby stop the rotation of the wafer 11 after the detection of the notch 15 by the notch detecting sensor 66, the notch 15 can be positioned in a predetermined direction relative to the holding plate 52.

Thus, in the conveying apparatus 16 according to the present embodiment, positioning can be performed at the time of conveying the wafer 11. In other words, it is unnecessary to separately provide a positioning mechanism, so that the processing apparatus 2 can be restrained from being increased in size and cost. In addition, since the wafer 11 can be positioned at the time of conveying, the time required for positioning the wafer 11 can be shortened as compared, for example, to the case where a positioning mechanism is separately provided.

Note that the present invention is not restricted to the description of the embodiment above, but can be carried out with various modifications. For instance, while the conveying apparatus 16 such that the top surface of the holding plate 52 is made to be the holding surface 54 and the lower surface of the wafer 11 is held onto the holding surface 54 by suction has been described in the embodiment above, the conveying apparatus of the present invention may be so configured that the lower surface of a holding plate is provided with a restriction member and jet ports (suction holding parts) so as to be a holding surface and the upper surface of the wafer can be held onto the holding surface by suction. In addition, while the plurality of jet ports (the first jet ports 54a and the second jet ports 54b) are provided as the suction holding parts in the above-described embodiment, only one jet port may be provided as a suction holding part. In other words, only one suction holding part may be provided.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A conveying apparatus comprising:
a holding plate having a holding surface destined to face a surface to be held of a wafer;
a restriction member provided on one end side of the holding surface, the restriction member adapted to contact a peripheral surface of the wafer so as to restrict movement of the wafer toward the one end side; and
means for moving the holding plate,
wherein a non-contact type suction holding part is formed at the holding surface, the suction holding part adapted to jet a fluid obliquely to the surface to be held of the wafer so as to move the wafer in a direction toward the restriction member and to generate a negative pressure between the holding surface and the surface to be held, thereby holding the wafer by suction, and
the fluid is jetted from the suction holding part so as to abut the wafer against the restriction member, thereby positioning the wafer at a predetermined position on the holding plate;
wherein a sensor for detecting a notch indicative of crystal orientation of the wafer is disposed at a position corresponding to the peripheral surface of the wafer,
the suction holding part includes:
a first suction holding part connected to a fluid supply source through a first suction path provided with a first opening control valve for controlling flow rate, the first suction holding part adapted to jet the fluid in a direction for rotating the wafer in a first rotating direction; and
a second suction holding part connected to the fluid supply source through a second suction path provided with a second opening control valve for controlling flow rate, the second suction holding part adapted to jet the fluid in a direction for rotating the wafer in a second rotating direction opposite to the first rotating direction, and
an opening of one of the first opening control valve and the second opening control valve is set to be greater than an opening of another of the first opening control valve and the second opening control valve so as to rotate the wafer in the first rotating direction or the second rotating direction, and, after detection of the notch by the sensor, the opening of the first opening control valve or the second opening control valve is controlled so as to stop rotation of the wafer, thereby positioning the notch in a predetermined orientation relative to the holding plate.

* * * * *